United States Patent
Wang et al.

[11] Patent Number: 6,057,193
[45] Date of Patent: May 2, 2000

[54] ELIMINATION OF POLY CAP FOR EASY POLY1 CONTACT FOR NAND PRODUCT

[75] Inventors: John Jianshi Wang, San Jose; Hao Fang, Cupertino; Masaaki Higashitani, Sunnyvale, all of Calif.

[73] Assignees: Advanced Micro Devices, Inc., Sunnyvale, Calif.; Fujitsu Limited, Kanagawa; Fujitsu AMD Semiconductor Limited, Fukushima, both of Japan

[21] Appl. No.: 09/061,515

[22] Filed: Apr. 16, 1998

[51] Int. Cl.⁷ .................................................. H01L 21/336
[52] U.S. Cl. ........................... 438/266; 438/261; 438/257; 438/618; 438/620; 438/631; 257/315; 257/316
[58] Field of Search ..................................... 257/315, 316; 438/620, 618, 631, 257, 253, 254, 261, 266

[56] References Cited

U.S. PATENT DOCUMENTS

| | | | |
|---|---|---|---|
| 5,094,971 | 3/1992 | Kanebako | 438/277 |
| 5,273,923 | 12/1993 | Chang et al. | 438/264 |
| 5,326,999 | 7/1994 | Kim et al. | 257/315 |
| 5,397,725 | 3/1995 | Wolstenholme et al. | 438/0 |
| 5,484,741 | 1/1996 | Bergemont | 438/257 |
| 5,491,099 | 2/1996 | Hsu | 437/35 |
| 5,516,713 | 5/1996 | Hsue et al. | 438/261 |
| 5,590,072 | 12/1996 | Choi | 365/185.01 |
| 5,607,873 | 3/1997 | Chen et al. | 438/620 |
| 5,627,395 | 5/1997 | Witek et al. | 257/350 |
| 5,631,179 | 5/1997 | Sung et al. | 438/264 |
| 5,641,712 | 6/1997 | Grivna et al. | 438/624 |
| 5,679,970 | 10/1997 | Hartmann | 257/320 |
| 5,933,729 | 8/1999 | Chan | 438/257 |

FOREIGN PATENT DOCUMENTS 0 655 755 A1  5/1995  European Pat. Off. .
0 663 695 A2  7/1995  European Pat. Off. .

OTHER PUBLICATIONS

"A 4-Mb NAND EEPROM with Tight Programmed $V_t$ Distribution" IEEE Journal of Solid-State Circuits, vol. 26, No. 4, Apr., 1991, pp. 492–496.

International Search Report, International Application No. PCT/US99/03043, International Filing Date Nov. 2, 1999 mailed Jun. 9, 1999.

*Primary Examiner*—David Hardy
*Assistant Examiner*—N. Drew Richards
*Attorney, Agent, or Firm*—Amin, Eschweiler & Turocy, LLP

[57] ABSTRACT

A method (200) of forming a NAND type flash memory device includes the steps of forming an oxide layer (202) over a substrate (102) and forming a first conductive layer (106) over the oxide layer. The first conductive layer (106) is etched to form a gate structure (107) in a select gate transistor region (105) and a floating gate structure (106a, 106b) in a memory cell region (111). A first insulating layer (110) is then formed over the memory cell region (111) and a second conductive layer (112, 118) is formed over the first insulating layer (110). A word line (122) is patterned in the memory cell region (111) to form a control gate region and source and drain regions (130, 132) are formed in the substrate (102) in a region adjacent the word line (122) and in a region adjacent the gate structure (107). A second insulating layer (140) is formed over both the select gate transistor region (105) and the memory cell region (111) and first and second contact openings are formed in the second insulating layer (140) down to the gate structure (107) and the control gate region, wherein a depth (X) through the second insulating layer (140) down to the gate structure (107) and down to the control gate region are approximately the same, thereby eliminating a substantial overetch of the gate structure contact opening.

9 Claims, 9 Drawing Sheets

ELIMINATION OF POLY CAP FOR EASY POLY1 CONTACT FOR NAND PRODUCT

FIELD OF THE INVENTION

The present invention generally relates to integrated circuits and, in particular, to a method of flash memory fabrication which improves memory cell reliability and manufacturability by substantially preventing poly1 punch-through by removing the poly cap layer from the stacked gate structure in a flash memory device. Consequently, when forming contacts down to poly1 and poly2, a substantial overetch is not required which prevents the occurrence of both high resistivity poly1 contacts and punch-through down to the substrate.

BACKGROUND OF THE INVENTION

Semiconductor devices typically include multiple individual components formed on or within a substrate. Such devices often comprise a high density section and a low density section. For example, as illustrated in prior art FIG. 1, a memory device such as a flash memory 10 comprises one or more high density core regions 12 and a low density peripheral portion 14 on a single substrate 16. The high density core regions 12 typically consist of at least one M×N array of individually addressable, substantially identical memory cells and the low density peripheral portion 14 typically includes input/output (I/O) circuitry and circuitry for selectively addressing the individual cells (such as decoders for connecting the source, gate and drain of selected cells to predetermined voltages or impedances to effect designated operations of the cell such as programming, reading or erasing).

Figure 2:
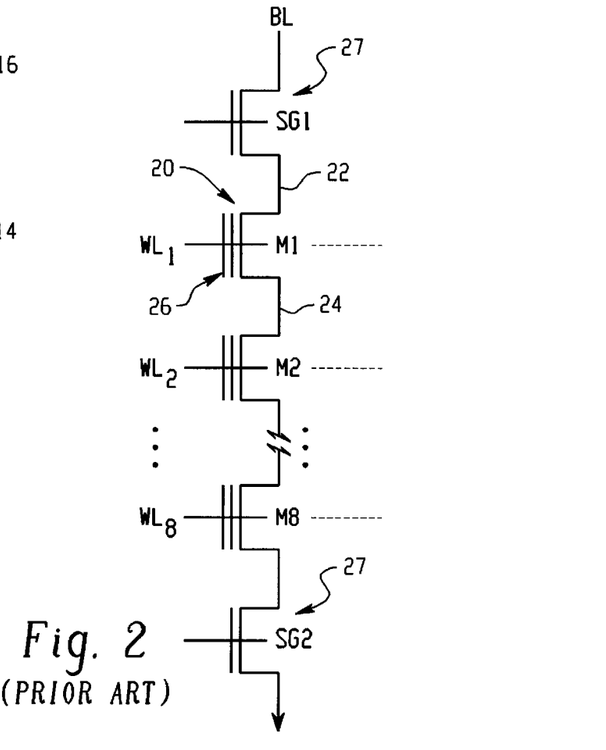
FIG. 2 is a schematic diagram illustrating a prior art core portion of a flash memory circuit.

The memory cells within the core portion 12 are coupled together in a circuit configuration, such as a NAND configuration illustrated in prior art FIG. 2. Each memory cell 20 has a drain 22, a source 24 and a stacked gate 26. Each stacked gate 26 is coupled to a word line (WL1, WL2, . . . , WL8) while the drains 22 and sources 24 are coupled together in series to form a bit line BL through two select gate transistors 27 (SG1 and SG2, respectively). Using peripheral decoder and control circuitry, each memory cell 20 can be addressed for programming, reading or erasing functions.

Figure 1:
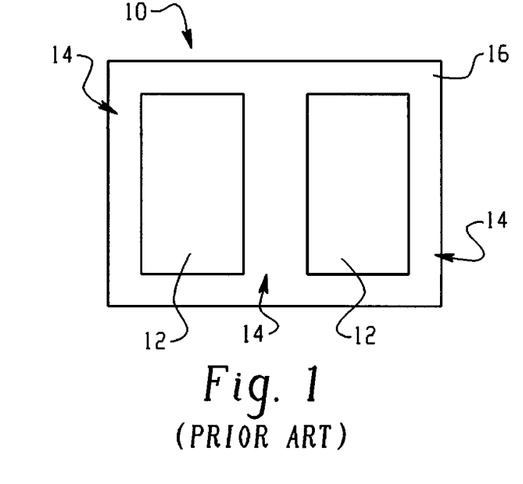
FIG. 1 is a plan view illustrating a prior art layout of a flash memory chip.
Figure 3:
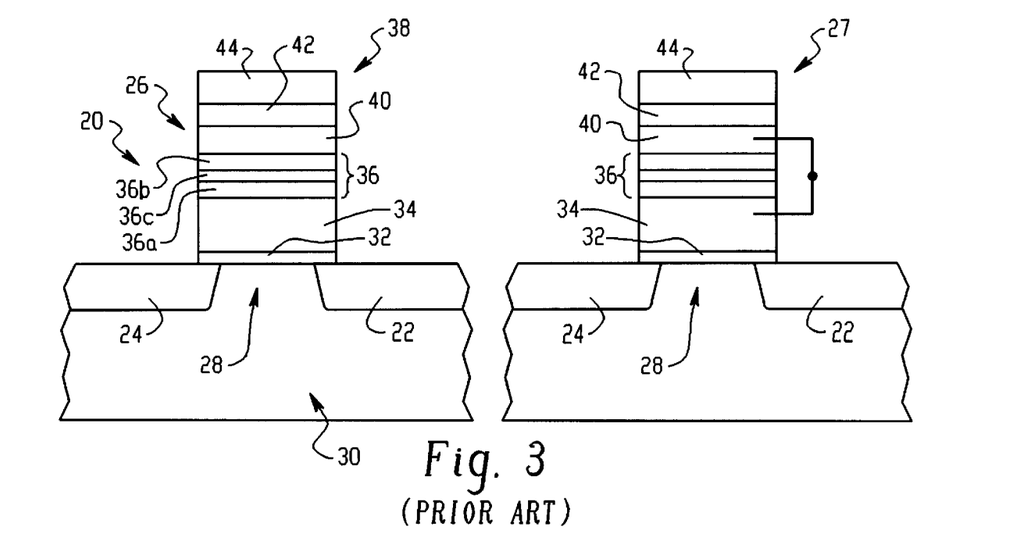
FIG. 3 is a fragmentary cross section illustrating a prior art stacked gate flash memory cell and a select gate transistor.

Prior art FIG. 3 represents a fragmentary cross section diagram of a typical memory cell 20 and a select gate transistor 27 in the core region 12 of prior art FIGS. 1 and 2. The memory cell 20 typically includes the drain 22, the source 24 and a channel 28 in a substrate 30; and the stacked gate structure 26 overlying the channel 28. The stacked gate 26 further includes a thin gate dielectric layer 32 (commonly referred to as the tunnel oxide) formed on the surface of the substrate 30. The stacked gate 26 also includes a polysilicon floating gate 34 which overlies the tunnel oxide 32 and an interpoly dielectric layer 36 overlies the floating gate 34. The interpoly dielectric layer 36 is often a multilayer insulator such as an oxide-nitride-oxide (ONO) layer having two oxide layers 36a and 36b sandwiching a nitride layer 36c. Lastly, a top region 38 overlies the interpoly dielectric layer 36. The top region 38 includes a control gate layer 40 formed of polysilicon, a tungsten silicide layer (WSi$_x$) 42 which overlies the control gate 40 and a poly cap layer 44 formed predominately of polysilicon.

The control gate 40 provides memory functions for the cell 20 as will be described in greater detail infra while the tungsten silicide layer 42 provides a low resistivity contact as is well known by those skilled in the art. The poly cap layer 44 overlies the tungsten silicide layer 42 and prevents the silicide layer 42 from peeling or cracking. The top regions 38 of the respective cells 20 that are formed in a lateral row (as opposed to a vertical column) share a common word line (WL) associated with the row of cells. The channel 28 of the cell 20 conducts current between the source 24 and the drain 22 in accordance with an electric field developed in the channel 28 by the stacked gate structure 26.

The select gate transistor 27 has a stacked gate structure similar to the memory cell except that the first polysilicon layer 34 and the second polysilicon layer 40 are shorted together to form a single gate type structure. The select gate transistor 27 operates according to traditional MOS transistor principles, wherein SG1 of prior art FIG. 2 ensures the selectivity of the particular bit line, while SG2 prevents the cells from passing current during the programming operation.

According to conventional operation, the flash memory cell 20 operates in the following manner. The cell 20 is programmed by applying a relatively high voltage V$_G$ (e.g., approximately 12 volts) to the control gate 38 and a moderately high voltage V$_D$ (e.g., approximately 9 volts) to the drain 22 in order to produce "hot" (high energy) electrons in the channel 28 near the drain 22. The hot electrons accelerate across the tunnel oxide 32 and into the floating gate 34 and become trapped in the floating gate 34 since the floating gate 34 is surrounded by insulators (the interpoly dielectric 36 and the tunnel oxide 32). As a result of the trapped electrons, the threshold voltage of the cell 20 increases by about 3 to 5 volts. This change in the threshold voltage (and thereby the channel conductance) of the cell 20 created by the trapped electrons is what causes the cell to be programmed.

To read the memory cell 20, a predetermined voltage V$_G$ that is greater than the threshold voltage of an unprogrammed cell, but less than the threshold voltage of a programmed cell, is applied to the control gate 40. If the cell 20 conducts, then the cell 20 has not been programmed (the cell 20 is therefore at a first logic state, e.g., a zero "0"). Likewise, if the cell 20 does not conduct, then the cell 20 has been programmed (the cell 20 is therefore at a second logic state, e.g., a one "1"). Consequently, one can read each cell 20 to determine whether it has been programmed (and therefore identify its logic state).

In order to erase the flash memory cell 20, a relatively high voltage V$_S$ (e.g., approximately 12 volts) is applied to the source 24 and the control gate 40 is held at a ground potential (V$_G$=0), while the drain 22 is allowed to float. Under these conditions, a strong electric field is developed across the tunnel oxide 32 between the floating gate 34 and the source region 22. The electrons that are trapped in the floating gate 34 flow toward and cluster at the portion of the floating gate 34 overlying the source region 22 and are extracted from the floating gate 34 and into the source region 22 by way of Fowler-Nordheim tunneling through the tunnel oxide 32. Consequently, as the electrons are removed from the floating gate 34, the cell 20 is erased.

Figure 4A:
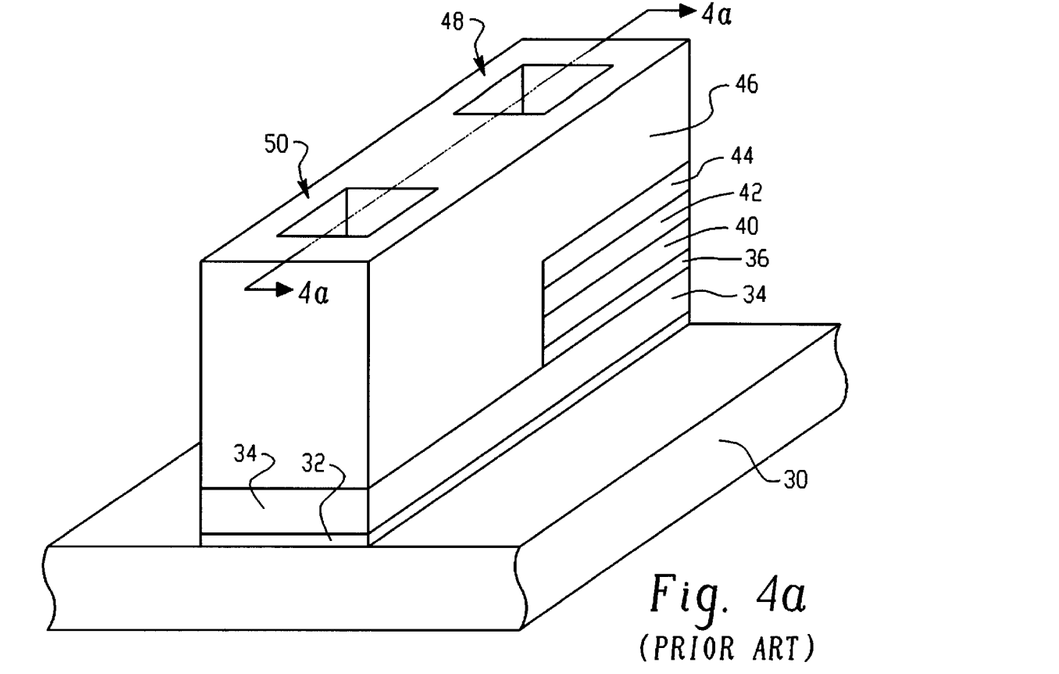
FIG. 4a is a fragmentary cross section illustrating the select gate transistor of FIG. 3 covered with an interlayer dielectric material.
Figure 4B:
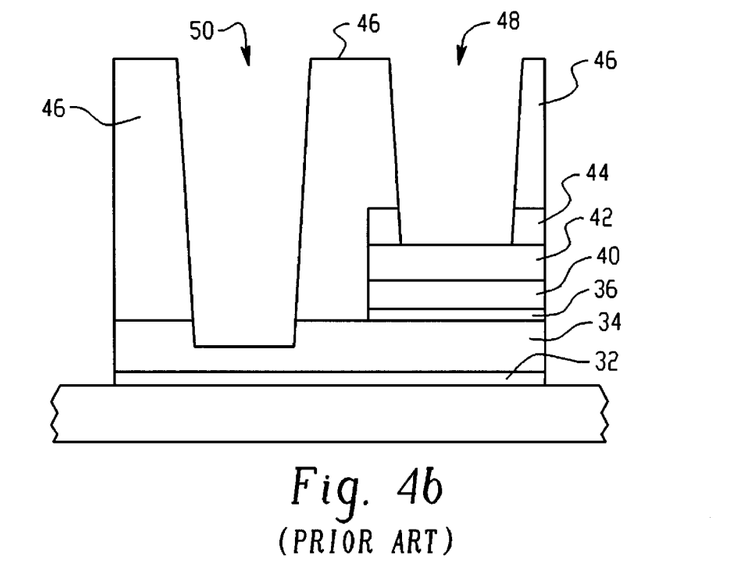
FIG. 4b is a fragmentary cross section illustrating the prior art stacked gate flash memory cell and select gate transistor of FIG. 4a having poly1 and poly2 contact openings in the interlayer dielectric material, wherein the poly1 contact opening extends through a substantial portion of the polysilicon gate portion of the select gate transistor.

During the processing of the core portion 12 having a circuit configuration as illustrated in prior art FIG. 2 and a structure as illustrated in prior art FIG. 3, a problem sometimes occurs involving the formation of poly1 and poly2 contacts, which is illustrated in prior art FIGS. 4a and 4b. A poly1 contact is a contact made to the polysilicon gate 34 of the select gate transistor 27 (wherein poly1 is the first layer of polysilicon) and a poly2 contact is a contact made to the tungsten silicide layer 42 of the top region 38 of the respective memory cells. A conductive layer is then formed over the poly1 and poly2 contact regions to short circuit the first and second layers of polysilicon, as illustrated in FIG. 3.

As illustrated in prior art FIG. 4a, after the select gate transistor 27 is formed, an oxide based interlayer dielectric 46 is formed over the core portion 12. The interlayer dielectric 46 isolates the various word lines and the select gate transistors 27 from overlying conductive layers which are subsequently formed and used to selectively interconnect the various components in the memory device. After the interlayer dielectric 46 is formed, a chemical mechanical polish (CMP) is implemented to polish the interlayer dielectric 46 to a uniform thickness of about 10,000 Angstroms. A photoresist mask (not shown) is then deposited and patterned to define contact openings in the interlayer dielectric 46. A contact etch step is then performed to simultaneously create a contact opening 48 in the interlayer dielectric 46 and the poly cap layer 44 down to the tungsten silicide layer 42 (the poly2 contact) and a contact opening 50 in the interlayer dielectric 46 down to the polysilicon gate 34 (the poly1 contact) for the select gate transistor 27.

The substantial overetch of the poly1 contact opening 50 occurs due to the high oxide-to-polysilicon selectivity of the contact etch. Therefore, although the poly cap layer 44 will be reached first in the poly2 contact opening 48 (before the polysilicon layer 34 is reached in the poly1 contact opening 50), the poly2 contact etch rate will dramatically slow once it reaches the poly cap layer 44 because the poly cap layer 44 is a polysilicon based material and the etch rate with respect to polysilicon is low. Therefore by the time the poly2 contact opening 48 extends through the entire poly cap layer 44 to reach the tungsten silicide layer 42, the poly1 contact opening 50 has reached the polysilicon gate 34 and caused a substantial overetch of the polysilicon gate 34, as illustrated in prior art FIG. 4b.

The substantial overetching of the prior art poly1 contact opening 50 results in potential punch-through problems, wherein the poly1 contact opening 50 extends down through the entire depth of the polysilicon gate 34 and punches through to the substrate 30. Such a punch-through phenomena renders the select gate transistor 27 inoperable, resulting in a functional failure of the memory device.

Alternatively, even if the poly1 contact opening 50 does not extend through the entire polysilicon gate 34, an appreciable portion of polysilicon will be removed which results in an increase in the resultant poly1 contact resistivity. Such an increase in contact resistivity may result in a parametric failure of the memory device or a latent reliability problem as the increased contact resistivity may cause thermal heating which further increases the resistivity of the contact, eventually leading to a device failure.

Consequently, there is a strong need in the art to form memory devices having poly1 and poly2 contacts without a substantial overetching of the poly1 contact.

SUMMARY OF THE INVENTION

The present invention embodies a method of forming a flash memory device that eliminates punch-through in poly1 contacts and also substantially prevents the formation of high resistivity poly1 contacts by reducing an amount of the poly1 contact overetch required to establish the poly1 and poly2 contact openings. According to one aspect of the present invention, an overetch of the poly1 contact opening is eliminated by removing the poly cap layer from the stacked gate structure where the poly2 contact opening is defined. Consequently, the amount of etching required to establish the poly1 contact opening and the poly2 contact opening is approximately the same. By eliminating the substantial overetch of the poly1 contact opening, the potential for poly1 punch-through is eliminated and the resistivity of the poly1 contact is substantially reduced, thereby improving the reliability of the memory device.

To the accomplishment of the foregoing and related ends, the invention comprises the features hereinafter fully described and particularly pointed out in the claim. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

DETAILED DESCRIPTION OF THE INVENTION

The present invention will now be described with reference to the drawings wherein like reference numerals are used to refer to like elements throughout. An embodiment of the present invention includes a method of eliminating poly1 contact punch-through and substantially reducing a poly1 contact resistivity by decreasing the overetching of the poly1 contact opening.

According to one exemplary embodiment of the present invention, a NAND type flash memory device has a plurality of memory cells coupled together in series, wherein one or more of the cells form stacked gate structures without a poly cap layer overlying the poly2 contact material (e.g., a tungsten silicide layer). The series coupled memory cells are coupled to one or more select gate transistors which perform control functionality for the selection, programming or erasing of the various memory cells (e.g., the selection of a bit line, etc.). Subsequently, the poly1 and poly2 contact openings are formed simultaneously, wherein the poly1 contact opening is for contact to a select gate transistor and the poly2 contact opening is for shorting the first and second conductive layers of a stacked gate structure together to form a select gate transistor, and wherein the required contact opening etch time of the poly1 and poly2 contact openings are approximately the same. Consequently, a substantial overetch of the poly1 contact opening is eliminated, resulting in the elimination of poly1 punch-through and a substantial reduction in the poly1 contact resistivity.

A method of forming a flash memory cell that eliminates poly1 punch-through and reduces poly1 contact resistivity according to one aspect of the present invention will be described in conjunction with FIGS. 5a–5l. In FIGS. 5a–5l the formation of a stacked gate flash memory cell and a select gate transistor are illustrated side by side in a fragmentary cross section. Although the corresponding figures illustrate the stacked gate flash memory cell and the select gate transistor in an exemplary arrangement and position for illustration purposes, it should be understood that the circuit layout may take a variety of alternative configuration and orientations and each such variation is contemplated as falling within the scope of the present invention.

Figure 5A:
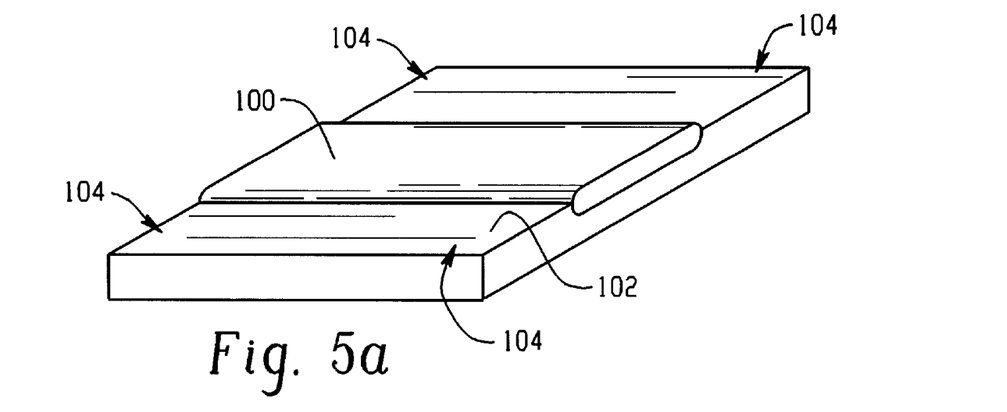
FIGS. 5a–5l are perspective and fragmentary cross section views illustrating a method for forming a flash memory device without a substantial poly1 contact opening overetch according to the present invention.

The manufacture of a flash memory cell and a corresponding select gate transistor according to one exemplary embodiment of the present invention begins with the formation of one or more field oxide regions 100 in a semiconductor substrate 102, as illustrated in FIG. 5a. The field oxide region 100 is conventionally formed by, for example, growing a layer of thermal oxide (also called "barrier oxide" or "pad oxide") over the surface of the substrate 102. A masking layer (not shown), frequently composed of nitride, is deposited on the barrier oxide and patterned to cover regions 104 of the substrate 102 in which memory cells are to be formed. After patterning the masking layer, the field oxide 100 is grown to a thickness of about 6,500 Angstroms in the exposed areas of the thermal oxide by, for example, local oxidation of silicon ("LOCOS"). The field oxide region 100 will provide electrical isolation between the various active regions 104 in which the memory cells will lie. After growing the field oxide 100, the masking layer and thermal oxide are stripped to expose the underlying substrate 102 in the regions 104, as illustrated in FIG. 5a.

Figure 5B:
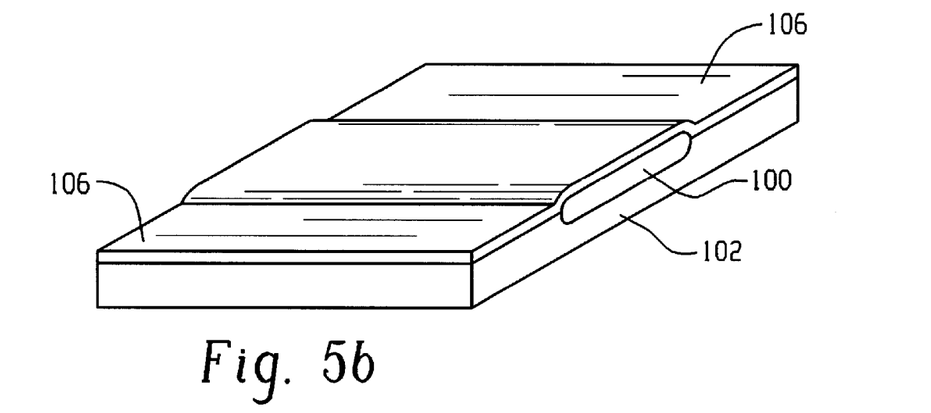

After the formation of the field oxide regions 100, a thin tunnel oxide layer (not shown) is formed over the substrate 102 in the regions 104 and 105 having a thickness of, for example, about 50–150 Angstroms using a thermal growth process in a dry oxidation furnace. After formation of the tunnel oxide, a first layer of polycrystalline silicon 106 ("polysilicon") having a thickness of about 700 Angstroms is deposited via, for example, low pressure chemical vapor deposition ("LPCVD") and doped via, for example, diffusion doping or ion implantation doping techniques to thereby make the first polysilicon layer less resistive. The deposited first polysilicon layer 106 is illustrated in FIG. 5b. (Note that the tunnel oxide underlies the first polysilicon layer 106, however, due to its relative thinness and for the sake of simplicity, the tunnel oxide layer is not shown in the figures.)

Figure 5C:
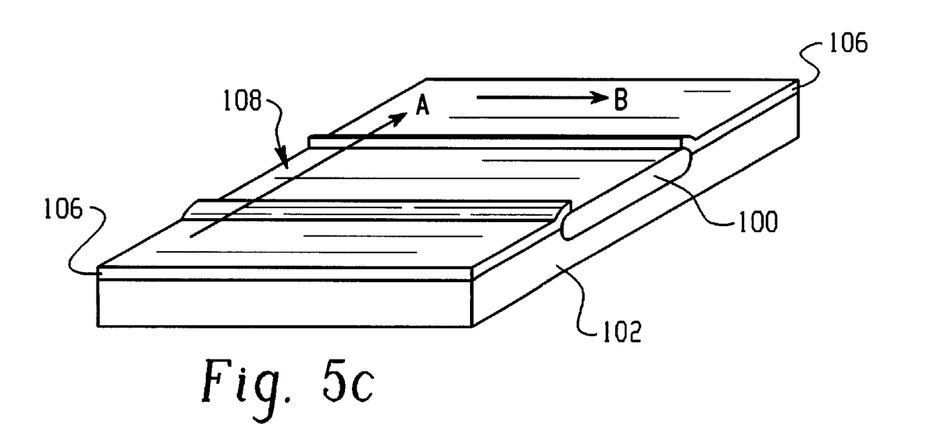

Subsequent to the deposition and doping of the first polysilicon layer 106, the layer 106 is etched to define the memory cells (via regions 106a and 106b) along the length of a single word line (which has not yet been defined) in the regions 104, as illustrated in FIGS. 5c. In one method according to the present invention, the etching of the polysilicon layer 106 is accomplished by depositing a photoresist layer and patterning the photoresist to form a photoresist mask.

The layer 106 is etched using, for example, a $HBrCl_2$ plasma etch chemistry as is well known by those skilled in the art. The etching step removes polysilicon in the region 108 which overlies a substantial portion of the field oxide region 100, thereby separating the polysilicon layer 106 into the two or more regions 106a and 106b, respectively, which are separated from one another by the field oxide region 100. This etch step defines various memory cells along the direction "A", as illustrated in FIG. 5c. The direction "A" is the direction in which the word lines (which will be formed later in the process) will extend and wherein each region 106a and 106b of the first polysilicon layer 106 will form a separate floating gate for a memory cell along a given word line. The etch step also defines bit lines in the direction "B" which is transverse to the word lines, as illustrated in FIG. 5c.

Figure 5D:
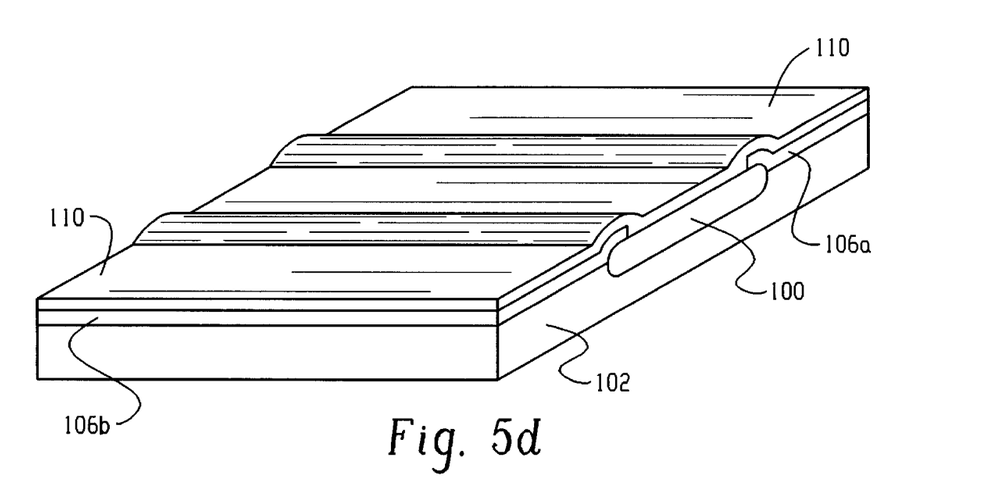

A multi-layer interpoly dielectric 110 is then formed over the surface of the substrate 102, as illustrated in FIG. 5d. This layer 110 is often called the interpoly dielectric since (as will be seen shortly) it is sandwiched between the first polysilicon layers 106a and 106b (the floating gate for each flash memory cell) and a second polysilicon layer which forms the control gate for each cell as well as the word line interconnect for each of the flash cells associated with a given word line. The interpoly dielectric 110 is preferably a three layer region of oxide/nitride/oxide (also called "ONO") and has a thickness of about 120 Angstroms. The ONO layer 110 is formed by repetitive depositions of oxide, nitride and oxide as is well known by those skilled in the art to form a dielectric layer in which the nitride is sandwiched between the two oxide layers. The ONO layer 110 overlies the entire surface of the substrate 102, including the region 108 where the first polysilicon layer 106 was etched.

Figure 5E:
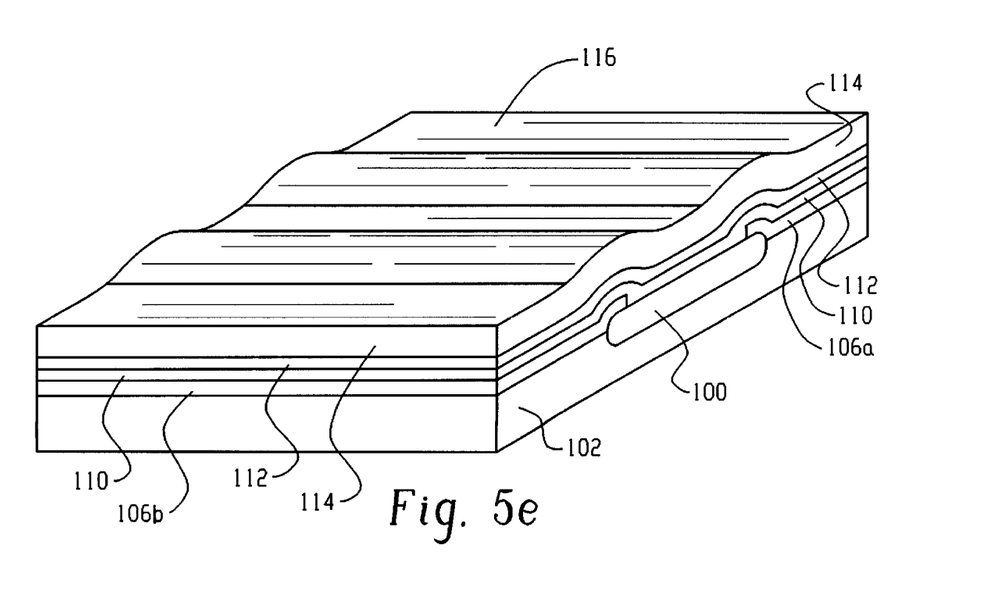

After the formation of the ONO layer 110, the remaining layers are formed which will complete the stack for each flash memory cell, as illustrated in FIG. 5e. These layers include a second polysilicon layer 112 and a tungsten layer 114 (for formation of a tungsten silicide as will be described infra). Unlike prior art flash memory devices, a poly cap layer is not formed over the memory cell portion of the device. Peeling or delamination of the tungsten silicide from the second polysilicon layer 112 may be prevented without use of a poly cap layer as will be discussed in greater detail below.

The second polysilicon layer 112 is deposited via, for example, LPCVD and will, in conjunction with the tungsten layer 114, form the control gate for each flash memory cell. The second polysilicon layer 112 is also doped in a manner similar to the first polysilicon layer 106 to lower the resistivity of the region. Immediately after the second polysilicon layer 112 is formed, the device (the entire wafer) is bathed in an inert gas (for example, nitrogen) to prevent the formation of native oxides on the polysilicon surface. Such an inert gas bath may be achieved, for example, by using a purge box (not shown) which encloses a wafer cassette which serves as a wafer transport and storage mechanism for the wafers between processing steps.

Preferably, the purge box is constructed of a non-reactive material that preferably does not out-gas oxygen (e.g., a clear polycarbonate). The inert gas (e.g., nitrogen) is fed to the purge box through a manifold at angles sufficient to fully bath the wafer (or wafers) in the gas while the wafer remains in the purge box. The purge box prohibits the oxidation of the second polysilicon layer 112 which can reduce the adhesion between the polysilicon and the overlying silicide (which will later be formed).

After removing the wafer from the purge box, the tungsten layer 114 is then formed by, for example, sputtering and a tungsten silicide layer is then formed by performing a thermal anneal, causing the tungsten layer 114 to react with a portion of the underlying polysilicon 112 at the interface of the two layers to form a tungsten silicide layer 118 (WSi$_x$). The silicide layer 118 provides a lower resistance contact for improved flash memory cell performance. Alternatively, the tungsten silicide layer 118 may be deposited as a silicide over the second polysilicon layer 112 via, for example, LPCVD.

Figure 5F:
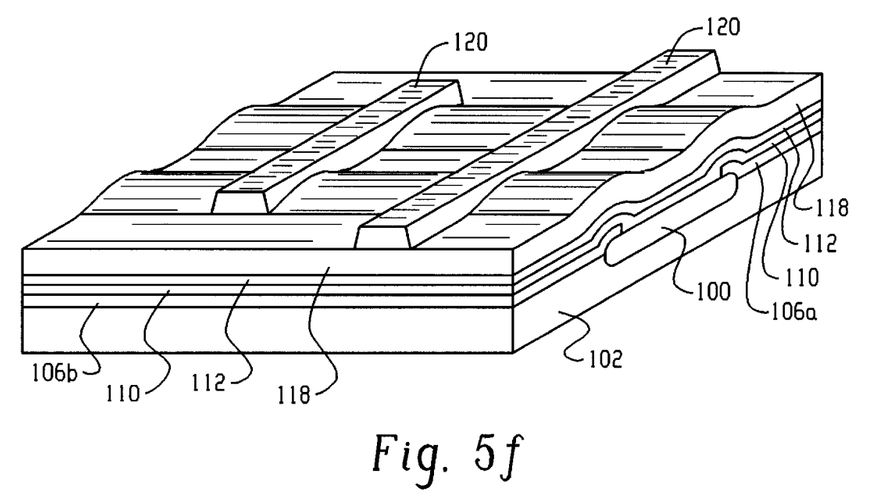
Figure 5G:
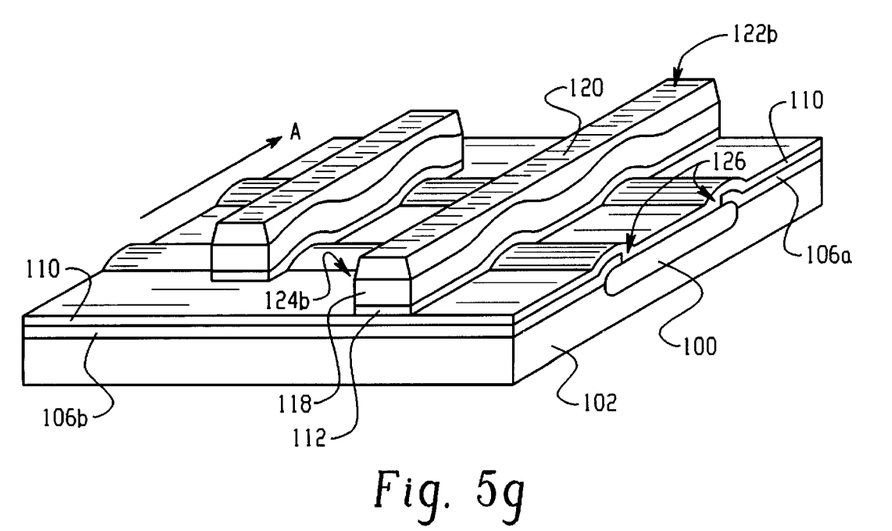

After the second polysilicon layer 112 and the tungsten silicide layer 118 of the memory stack structure have been formed, a plurality of word lines for the memory cells are defined by etching, thereby creating stack structures. The etching is achieved by depositing and defining a photoresist masking layer 120 of approximately 8,000 Angstroms over the entire surface of the device, as illustrated in FIG. 5f. Subsequently, a number of successive etching steps are performed. The remaining word lines 122a and 122b are defined by stack structures 124a and 124b (after each of the above etch steps is completed), as illustrated in FIG. 5g. Note that in this structure the word lines 122a and 122b are formed in the direction "A" which is transverse to the etching of the first polysilicon layers 106a and 106b, respectively.

Once the second polysilicon layer 112 and the tungsten silicide layer 118 have been removed, a self-align etch ("SAE") is performed in the memory cell region to remove the ONO layer 110 and the first polysilicon regions 106a and 106b in the regions that are not covered by the stack structure 124. The SAE etch is a two step etch process in which the ONO layer 110 is first removed followed by the removal of portions of the polysilicon regions 106a and 106b.

Figure 5H:
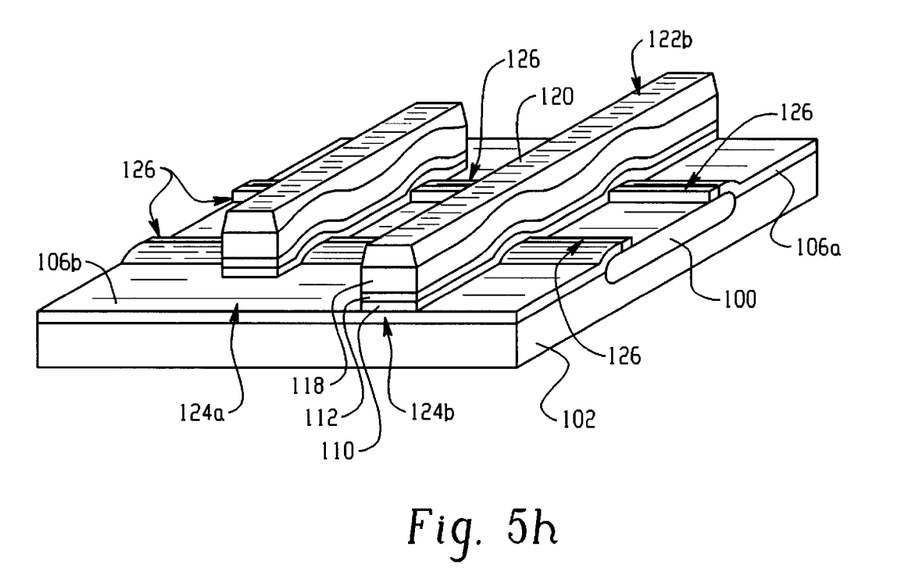

As illustrated in FIGS. 5h, the ONO layer 110 is first removed, leaving an ONO fence 126 along the polysilicon profiles of regions 106a and 106b. The second phase of the SAE etch is the removal of the exposed polysilicon regions 106a and 106b to thereby further define the floating gate structures for each respective word line 122. The polysilicon etch includes, for example, an HBrClO$_2$ RIE etch chemistry that is highly anisotropic.

Figure 5I:
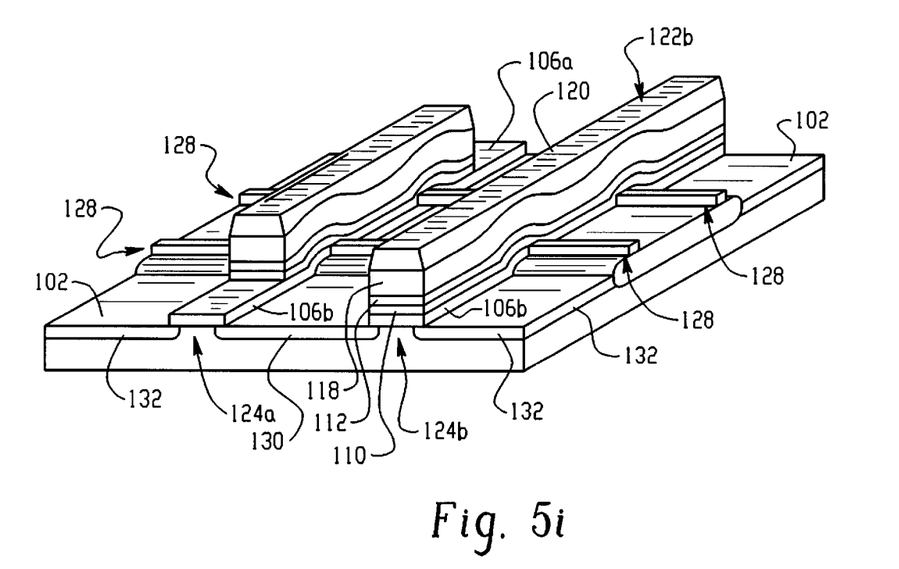

The fabrication of the flash memory cell and the select gate transistor is then completed by forming the source and drain regions 130 and 132, respectively by, for example, ion implantation as illustrated in FIG. 5i. During the formation of the source and drain regions 130 and 132, the stacked gate structure 124 serves as a self-aligning mechanism. After formation of the source and drain regions 130 and 132, the resist mask 120 is removed. In the above manner, a method for forming flash memory cells is provided.

Figure 5J:
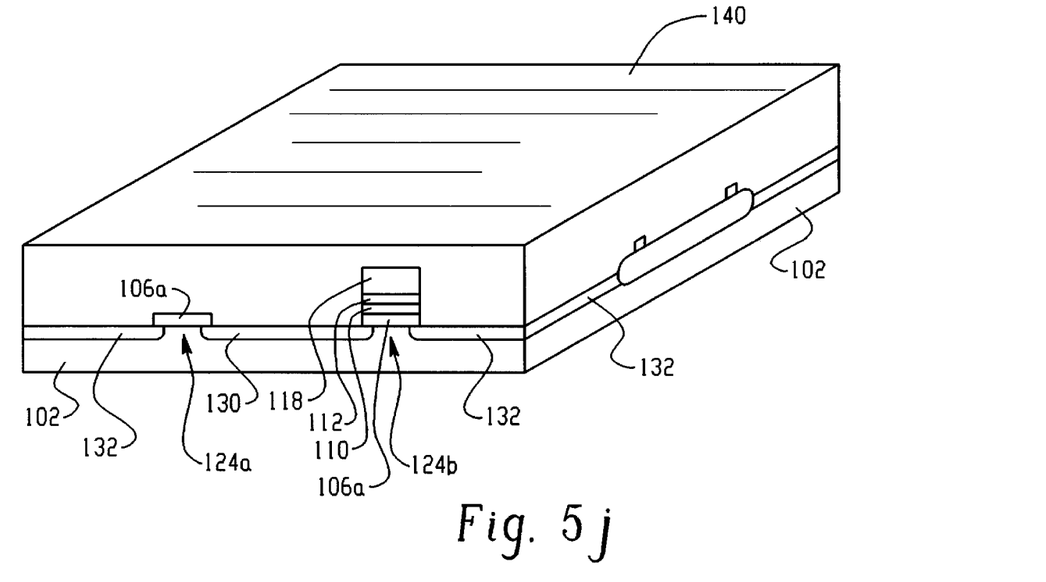

At this point, the stacked gate flash memory cell and the select gate transistor must be interconnected with other components to make the flash memory device operational. The interconnection process is accomplished by overlying the completed components (both the select gate transistor region 105 and the memory cell region 111) with an insulating layer 140, as illustrated in FIG. 5j, which may also be called in interlayer dielectric since it is used to isolate conductive layers from one another. The interlayer dielectric 140 is preferably formed using two layers, wherein a first high temperature oxide (HTO) layer is formed in a furnace to a thickness of about 1,000 Angstroms. A second oxide film is then preferably formed over the HTO via a plasma enhanced chemical vapor deposition to a thickness of about 15,000 Angstroms. After depositing the interlayer dielectric 140, a chemical-mechanical polish is performed to polish the layer 140 to a uniform height of about 10,000 Angstroms above the silicide layer 118 (note that FIG. 5j is not drawn to scale).

Figure 5K:
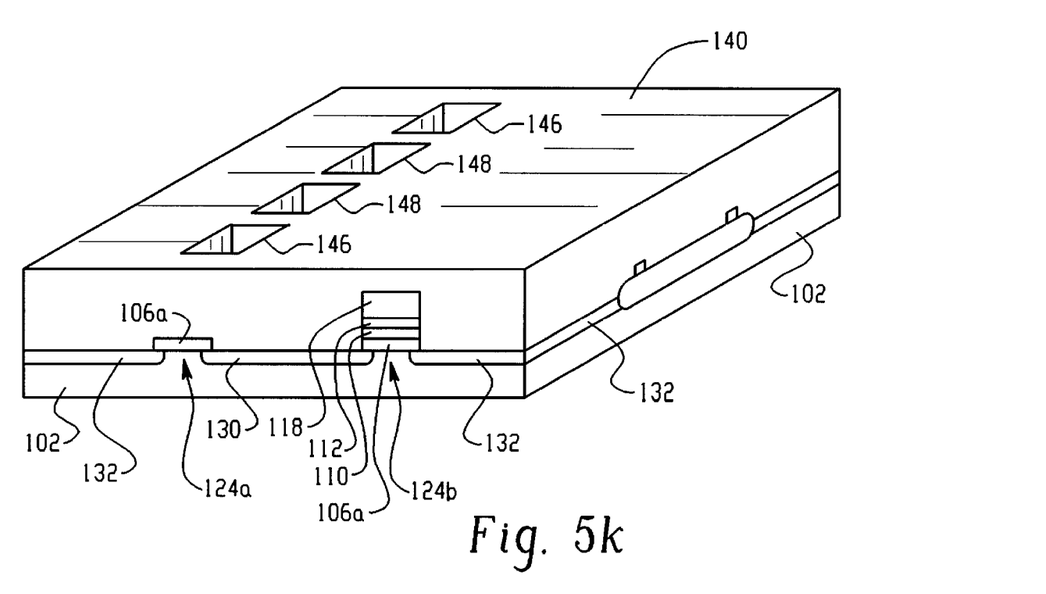
Figure 5L:
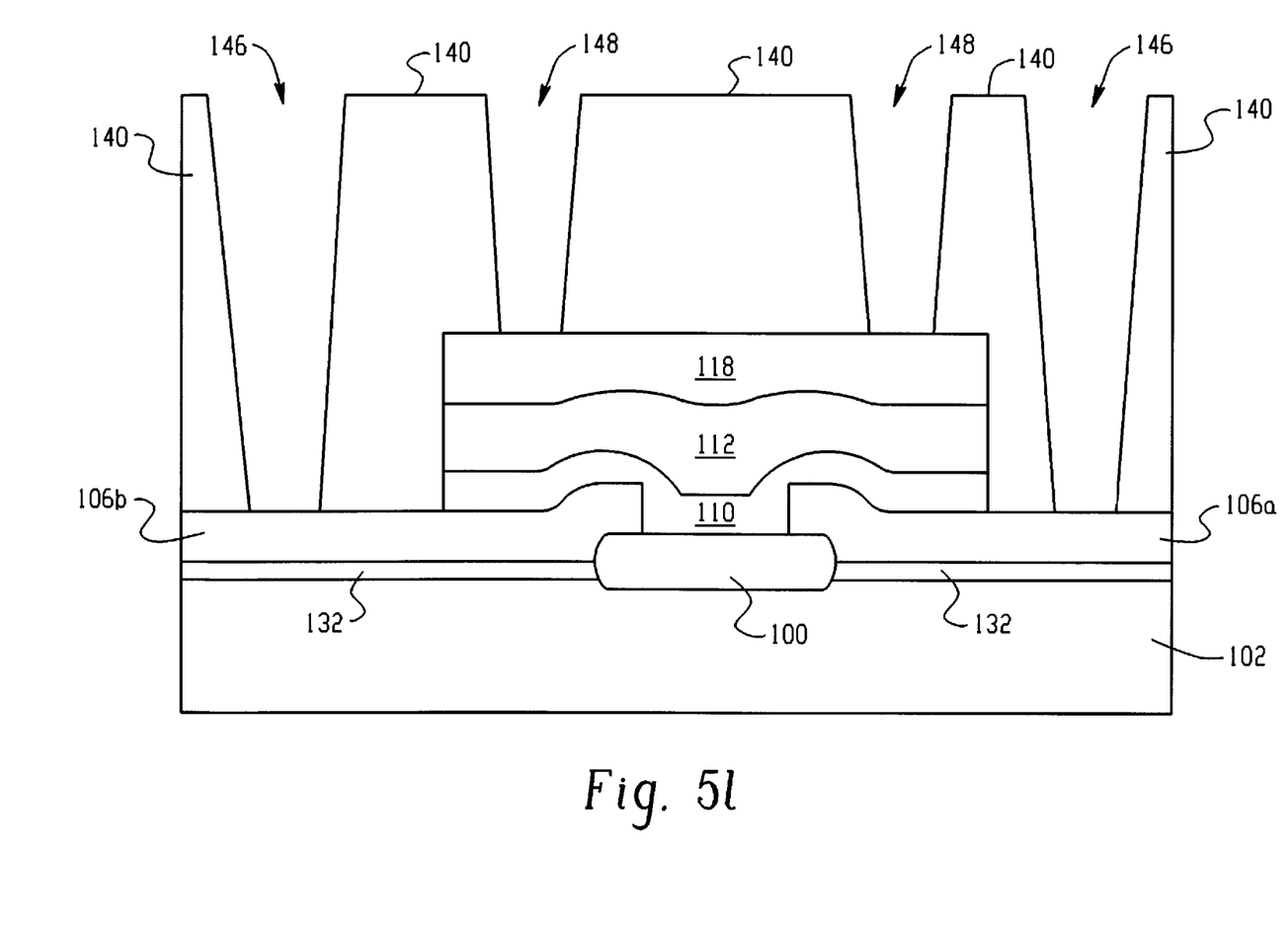

After the insulating layer 140 is formed, poly1 contact openings 146 and poly2 contact openings 148 are formed at the same time by depositing and patterning a photoresist mask (not shown) to define the contact openings 146 and 148. The contact openings are then formed, as illustrated in FIG. 5k, via, for example, a plasma etch using CF$_3$H and N$_2$.

The present invention overcomes the disadvantages of the prior art by eliminating the poly cap layer, thereby making the required etch times for the poly1contact openings 146 and the poly2 contact openings 148 approximately the same. Although the poly1 contact openings 146 are substantially deeper than the poly2 contact openings, the etch is highly selective so that the etching substantially stops when the etch openings 148 reach the tungsten silicide layer 118. Therefore the poly1 contact openings 146 may be completed without a substantial overetch of the tungsten silicide layer 118 and no overetch of the first polysilicon layers 106a and 106b. Therefore when both of the contact openings 146 and 148 are formed simultaneously, a substantial overetch of the polysilicon gate 106a or 106b of the select gate transistor does not occur in the poly1 contact opening 146. Consequently, potential punch-through (through the polysilicon gate 106a or 106b down to the substrate 102) is prevented. In addition, the elimination of the overetch of the polysilicon gate 106a or 106b allows the resistivity of the poly1 contact to be minimized. This feature further improves the quality and reliability of the device.

Once the contact openings 146 and 148 are formed, the various components are interconnected as desired by depositing and patterning one or more conductive layers (not shown) over the insulating layer 140 as is well known by those skilled in the art. The conductive layers make electrical contact to the select gate transistor and the stacked gate flash memory cell via the contact openings 146 and 148, respectively to thereby complete the fabrication of the memory device.

Figure 6:
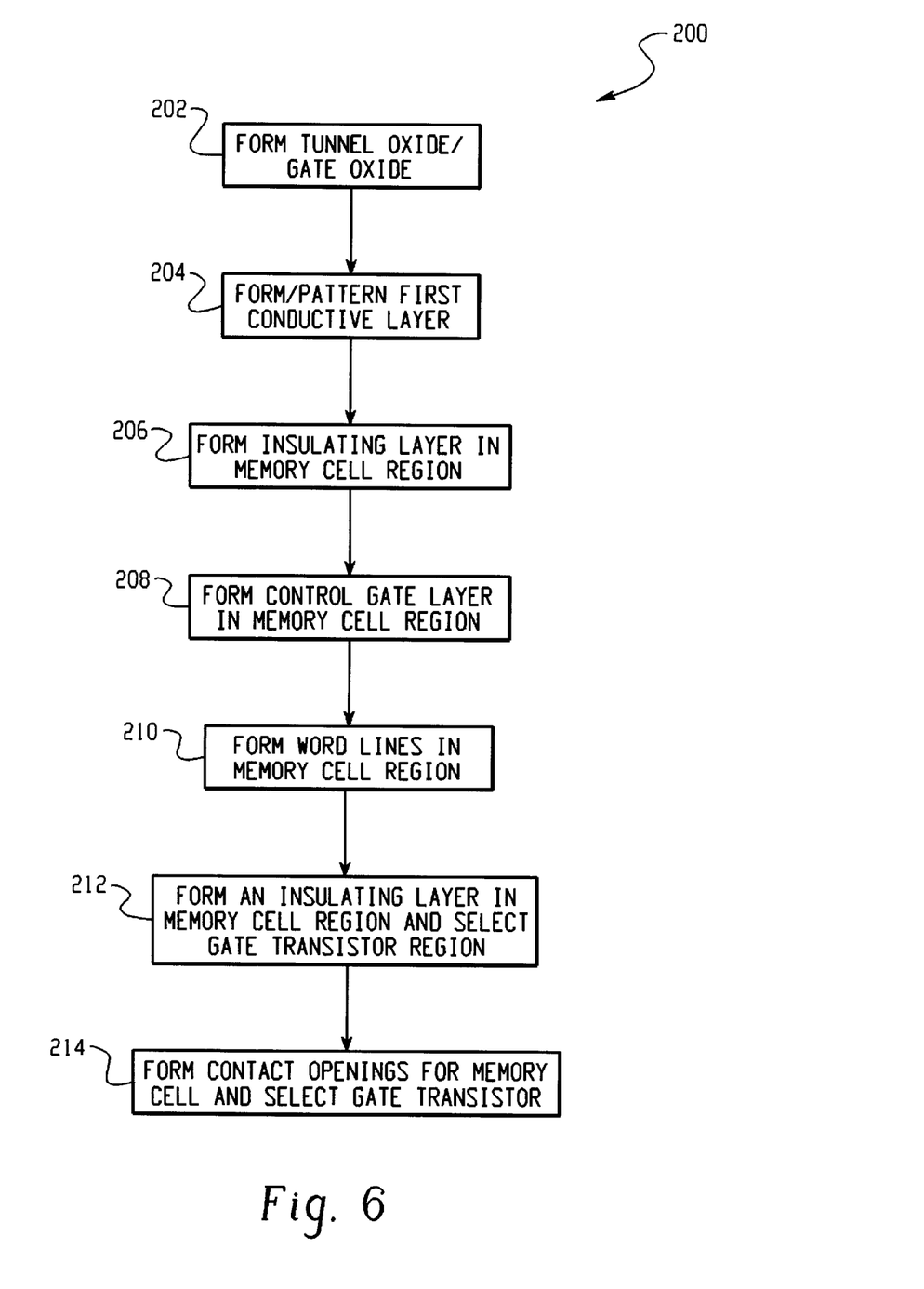
FIG. 6 is a flow chart illustrating manufacturing steps in a method for forming a flash memory without a substantial poly1 contact opening overetch in accordance with the embodiment of the present invention exemplified in FIGS. 5a–5k.

Although the present invention has been described in conjunction with a particular set of exemplary processing steps, the method is equally applicable to any semiconductor manufacturing process in which a flash memory device having a select gate transistor and a stacked gate structure is fabricated. This method is illustrated in the flowchart of FIG. 6. The method 200 includes the step of forming an oxide layer in the select gate transistor region 105 (a gate oxide) and the memory cell region 111 (a tunnel oxide) over the substrate 102 at step 202. Any method by which a thin oxide region may be formed is contemplated as falling within the scope of the present invention. Next, a first conductive layer such as, for example, the first polysilicon layer 106 (which will eventually form the floating gates of various memory cells and the gate of the select gate transistor) is formed and then patterned at step 204. Any method of forming and patterning the first conductive layer is contemplated as falling within the scope of the present invention.

The method 200 further includes forming an insulating layer in the memory cell region 111 at step 206. Although an ONO layer 110 is preferred, any type of insulating material is contemplated as falling within the scope of the present invention. A control gate layer is then formed over the insulating layer in the memory region 111 at step 208. The control gate layer is preferably a polysilicon layer and a tungsten silicide layer, however, any conductive material that can function as a control gate for a stacked gate flash memory cell is contemplated as falling within the scope of the present invention. The control gate layer, however, does not include a poly cap layer.

The method 200 further includes the step of forming the word lines by delineating one word line from another at step 210. Although this step is preferably accomplished by successive etch steps to remove various stack layers in regions between the desired word lines, any method by which the word lines are formed are contemplated as falling within the scope of the present invention. Step 210 also includes the formation of the source and drain regions in the substrate 102 for both the select gate transistor and the stacked gate flash memory cell. Although the source and drain regions are preferably formed by ion implantation and thermal annealing, any suitable method for forming the source and drain regions is contemplated as falling within the scope of the present invention.

After delineating the word lines at step 210, a second insulating layer (which may be referred to as an interlayer dielectric) is formed over both the select gate transistor region 105 and the memory cell region 111 at step 212. Contact openings are then simultaneously formed down to the control gate layer of the stacked gate flash memory cells and the gate of the select gate transistor at step 214, wherein the etch depth needed to reach both the control gate and the select gate transistor gate is approximately the same. Consequently, the need for a substantial overetch of the select gate transistor contact opening is eliminated. In addition, the reduction in the overetch of the select gate transistor contact opening eliminates punch-through and reduces the resistivity of the select gate transistor contact.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application.

What is claimed is:

1. A method of forming a NAND type flash memory device, comprising the steps of:

forming an oxide layer over a substrate;

forming a first conductive layer over the oxide layer;

patterning the first conductive layer, thereby forming a gate structure in a select gate transistor region and a floating gate structure in a memory cell region;

forming a first insulating layer in the memory cell region;

forming a polysilicon layer over the first insulating layer;

exposing the device to an inert gas after formation of the polysilicon layer, wherein the inert gas prevents substantially the polysilicon layer from oxidizing, thereby preventing a reduction in adhesion between the polysilicon layer and a subsequently formed overlying layer;

forming a metal layer over the polysilicon layer;

performing an anneal wherein the metal layer and the polysilicon layer reacts to form a silicide layer;

patterning a word line in the memory cell region and in the select gate transistor region, thereby forming a control gate region in the memory cell region and a stepped structure in the select gate transistor region, wherein the stepped structure includes a first portion in which a portion of the gate structure is exposed and a second portion in which the silicide layer is exposed;

forming source and drain regions in the substrate in regions adjacent the word lines, respectively;

forming a second insulating layer over both the select gate transistor region and the memory cell region;

etching a first contact opening in the second insulating layer in the first portion of the select gate transistor region down to the gate structure and a second contact opening in the second insulating layer in the second portion of the select gate transistor region down to the silicide layer; and forming and patterning a second conductive layer over at least the select gate transistor region, wherein the second conductive layer fills the first contact opening and the second contact opening, thereby substantially shorting the first conductive layer and the silicide layer together in the select gate transistor region.

2. The method of claim 1, wherein forming the oxide layer comprises thermally growing the oxide layer in a dry oxidation furnace.

3. The method of claim 1, wherein forming the first conductive layer comprises depositing a polycrystalline silicon layer and doping the polycrystalline silicon layer with impurity ions.

4. The method of claim 1, wherein patterning the first conductive layer comprises etching the first conductive layer with a $HBrCl_2$ plasma etch chemistry.

5. The method of claim 1, wherein forming the first insulating layer comprises the steps of:

depositing a first oxide layer;

depositing a nitride layer over the first oxide layer; and depositing a second oxide layer over the nitride layer.

6. The method of claim 1, wherein patterning a word line comprises the steps of selectively etching the polysilicon layer, the first insulating layer and the first conductive layer in a direction transverse to the floating gate structure, wherein the etched polysilicon layer forms the control gate region for a stacked gate flash memory cell.

7. The method of claim 1, wherein forming the second insulating layer comprises depositing an oxide based insulating material and performing a chemical-mechanical polish to make a top portion of the second insulating layer substantially flat, wherein after the polish the second insulating layer has a thickness of about 10,000 Angstroms.

8. The method of claim 7, wherein the step of depositing the oxide based insulating material comprises growing a high temperature oxide (HTO) in a furnace and depositing another oxide layer on the HTO via a plasma enhanced chemical vapor deposition.

9. The method of claim 1, wherein the step of forming the first and second contact openings comprise etching the second insulating layer with a $CF_3H$ and $N_2$ etch chemistry.

* * * * *

UNITED STATES PATENT AND TRADEMARK OFFICE
CERTIFICATE OF CORRECTION

PATENT NO.    : 6,057,193
DATED         : May 2, 2000
INVENTOR(S)   : John Jianshi Wang, Hao Fang, Masaaki Higashitani

It is certified that error appears in the above-identified patent and that said Letters Patent is hereby corrected as shown below:

Drawings,
Figure 4a
Figure 5a
Figure 5c
Figure 5g
Figure 5i
Figure 5j
Should appear as shown on the attached pages.

Signed and Sealed this

Eleventh Day of December, 2001

Attest:

NICHOLAS P. GODICI
Attesting Officer    Acting Director of the United States Patent and Trademark Office Fig. 4a
(PRIOR ART)